(12) United States Patent
Alexander et al.

(10) Patent No.: US 6,891,258 B1
(45) Date of Patent: May 10, 2005

(54) INTERPOSER PROVIDING LOW-INDUCTANCE DECOUPLING CAPACITANCE FOR A PACKAGED INTEGRATED CIRCUIT

(75) Inventors: Mark A. Alexander, Boulder, CO (US); Robert O. Conn, Los Gatos, CA (US); Steven J. Carey, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 139 days.

(21) Appl. No.: 10/313,482

(22) Filed: Dec. 6, 2002

(51) Int. Cl.[7] .......................... H01L 23/48; H01L 23/34
(52) U.S. Cl. ................. 257/678; 257/738; 257/774; 257/777; 257/780; 257/737; 257/713; 257/722; 257/690; 257/691; 257/698; 257/699; 257/784
(58) Field of Search ................. 257/738, 774, 257/777, 780, 737, 713, 722, 784, 690, 691, 698, 699

(56) References Cited

U.S. PATENT DOCUMENTS

| | | | |
|---|---|---|---|
| 5,880,925 A | 3/1999 | DuPre et al. | |
| 6,342,681 B1 | 1/2002 | Goldberger et al. | |
| 6,459,561 B1 | 10/2002 | Galvagni et al. | |
| 6,477,032 B2 | 11/2002 | Makl, Jr. | |
| 2002/0101702 A1 | 8/2002 | Maki, Jr. | |
| 2003/0001287 A1 * | 1/2003 | Sathe | 257/780 |
| 2003/0062602 A1 * | 4/2003 | Frutschy et al. | 257/666 |

* cited by examiner

Primary Examiner—Allan R. Wilson
Assistant Examiner—Joseph Nguyen
(74) Attorney, Agent, or Firm—Lois D. Cartier; LeRoy D. Maunu

(57) ABSTRACT

Structures that provide decoupling capacitance to packaged IC devices with reduced capacitor and via parasitic inductance. A capacitive interposer structure is physically interposed between the packaged IC and the PCB, thus eliminating the leads and vias that traverse the PCB in known structures. A capacitive interposer is mounted to a PCB and the packaged IC is mounted on the interposer. The interposer has an array of lands on an upper surface, to which the packaged IC is coupled, and an array of terminals on a lower surface, which are coupled to the PCB. Electrically conductive vias interconnect each land with an associated terminal on the opposite surface of the interposer. Within the interposer, layers of a conductive material alternate with layers of a dielectric material, thus forming parallel plate capacitors between adjacent dielectric layers. Each conductive layer is either electrically coupled to, or is electrically isolated from, each via.

53 Claims, 7 Drawing Sheets

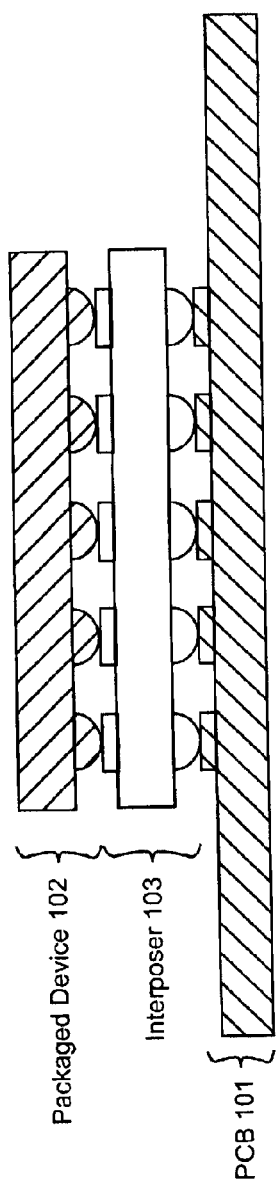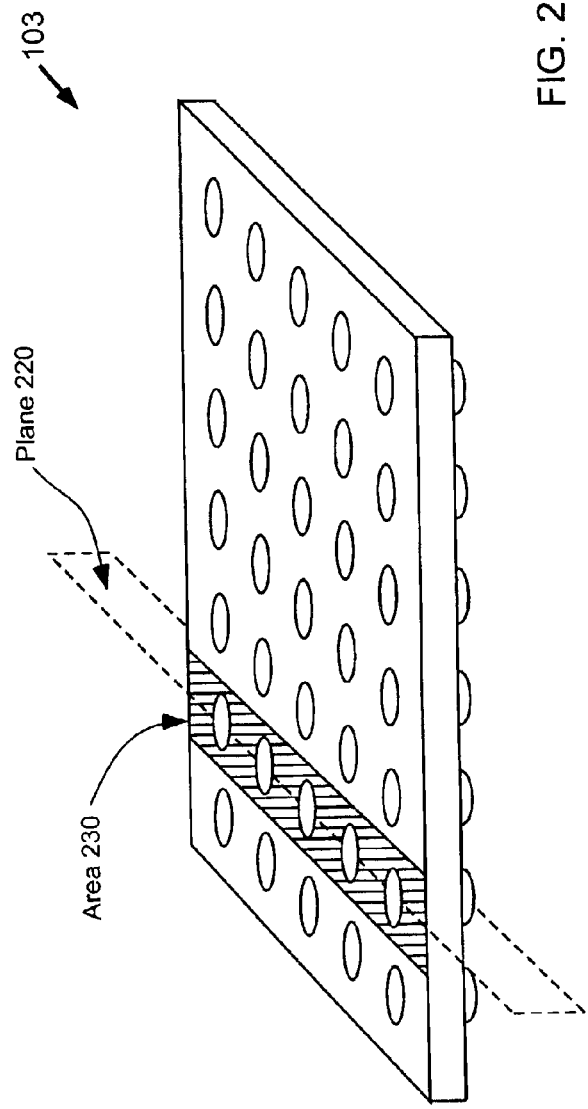

INTERPOSER PROVIDING LOW-INDUCTANCE DECOUPLING CAPACITANCE FOR A PACKAGED INTEGRATED CIRCUIT

FIELD OF THE INVENTION

The invention relates to surface-mount coupler devices and capacitors. More particularly, the invention relates to an interposer that can be used to mount a packaged integrated circuit on a printed circuit board while providing low-inductance capacitive decoupling for the IC.

BACKGROUND OF THE INVENTION

Systems that include integrated circuit (IC) devices typically include decoupling capacitors (also known as bypass capacitors) as well. A decoupling capacitor is a capacitor coupled between the power and ground pins (i.e., terminals) of a packaged IC to reduce noise on the power system within the IC. (The word "coupled" as used herein means "electrically connected in such as way as to pass direct current" as opposed to "capacitively coupled", except where the phrase "capacitively coupled" is explicitly used.) While in some cases the IC itself includes some decoupling capacitance, the amount of capacitance required is such that one or more additional decoupling capacitors are usually added external to the packaged device.

In the past, the location of these decoupling capacitors was a less important issue. The switching frequency of a device was relatively low, e.g., in the range of hundreds of kHz (kilohertz) to tens of MHz (megahertz). The transient currents within the device were also relatively low. Hence, parasitic inductance in the printed circuit board (PCB) mountings was not an important consideration. For example, for an IC mounted in a medium-performance package, whether leaded or surface-mounted to the PCB, a 0.1 uF (microfarad) decoupling capacitor could typically be mounted on the PCB anywhere within a few inches of the packaged IC.

Many ICs now operate at clock frequencies in the hundreds of MHz. At these higher frequencies, transient currents are significantly higher than in the past, and parasitic inductance is a much more important issue. Parasitic inductance within the capacitors themselves has been reduced by improving the packaging of the capacitors, e.g., by using only surface-mount packages and by reducing the size of the packages. (Smaller packages inherently have a lower parasitic inductance.) Parasitic inductance within the PCB mountings has also been reduced through improved layout techniques, e.g., by using dedicated power planes in the PCB, by improving capacitor land geometries, and by careful placement of the capacitors to reduce the distance between the packaged IC and the capacitors.

However, as operating frequencies continue to increase, even these measures become inadequate. One bottleneck in the current path between a decoupling capacitor and the associated packaged IC are the vias that transport charge from the capacitor lands through the PCB to the power planes, and then from the power planes through the PCB to the device. These vias can contribute parasitic inductance in the range of 1.5 nH (nanohenrys) each. If this via inductance could be reduced or eliminated, providing for high-frequency transient current would be much easier.

Therefore, it is desirable to provide systems and structures that provide decoupling capacitance to IC devices with reduced capacitor parasitic inductance. It is further desirable to reduce via parasitic inductance in these systems and structures.

SUMMARY OF THE INVENTION

The invention provides systems and structures that provide decoupling capacitance to packaged IC devices with reduced capacitor and via parasitic inductance compared to known systems and structures. This goal is accomplished by interposing a capacitive structure physically between the packaged IC and the PCB, thus eliminating the leads and vias that traverse the PCB in known systems and structures.

A capacitive interposer according to the invention is a device separate from the packaged IC. In some embodiments, the capacitive interposer has a comparable footprint (i.e., area of coverage on the PCB) to the packaged IC. The interposer is mounted to a PCB and the packaged IC is mounted on the interposer. The interposer has an array of lands on an upper surface, to which the packaged IC is coupled, and an array of terminals on a lower surface, which are coupled to the PCB. (The terms "upper surface" and "lower surface" are used herein for convenience, without implying any actual physical orientation of the surfaces with respect to any other object or structure.) Electrically conductive vias (e.g., filled with conductive plating material and then possibly filled with solder material) interconnect each land with an associated terminal on the opposite surface of the interposer. In some embodiments, at least some of the vias are manufactured using a resistive material such as a thick film resistive material. These resistive vias can provide, for example, built-in series termination for the signals traversing the vias, or pullup or pulldown devices for the signals.

In some embodiments, the IC package is a ball grid array (BGA) package having balls soldered to the lands of the interposer, while the terminals of the interposer are balls soldered to the PCB using known surface-mount techniques. The terminals can also be leads, lands, columns, or any other structures used for electrically interconnecting two devices.

Within the interposer, layers of a conductive material alternate with layers of a dielectric material, thus forming parallel plate capacitors between adjacent conductive layers. The conductive material can be metal, for example. The dielectric material can be, for example, a ceramic material, an organic material such as a polyimide or polyamide thin film, an inorganic material such as tantalum or aluminum oxide, or any other suitable dielectric material. In some embodiments, the dielectric material is a composite of epoxy and glass fibers, such as the commonly-known material called "FR4". In some embodiments, different dielectrics are used in different dielectric layers, or in different portions of the same dielectric layer.

Each conductive layer includes one or more "keepout areas" disposed around one or more vias. The keepout areas are filled with an electrically insulating material (thereby forming the "keepouts"). Thus, each keepout electrically isolates the conductive layer from the via. Thus, depending on whether or not the keepout is present for each via, a conductive layer is either electrically isolated from, or is electrically coupled to, each package pin of the packaged IC.

The interposer vias have a much smaller parasitic inductance than the PCB vias formerly used to transport current between a packaged IC and the associated decoupling capacitors. This reduced parasitic inductance is due to the fact that the interposer is typically much thinner than the PCB. Therefore the interposer vias are typically much shorter than the PCB vias, and have correspondingly lower inductance values.

In some embodiments, some vias are electrically isolated from all of the conductive layers. These vias are used to pass signals between the packaged IC and the PCB without additional capacitance other than the relatively small capacitance associated with the via itself.

In some embodiments, every other conductive layer is a ground layer (GND), while the remaining conductive layers are power layers (VCC). Therefore, in some embodiments more than one conductive layer is provided for a single power supply. In some embodiments, one or more conductive layers are provided for each of two or more power supplies. These embodiments are particularly useful for ICs that require decoupling capacitors for two or more positive power supplies at different voltage levels. In some embodiments, the interposer includes conductive layers only for those power supplies having the greatest transient currents.

In some embodiments, the body of the interposer includes an additional conductive layer that includes conductive traces. In these embodiments, not all balls in the packaged IC have corresponding vias in the interposer. Instead, the balls of the packaged IC come into contact with "partial vias" that extend only as far as the additional conductive layer, which routes a signal "sideways" through the conductive layer to another partial via that makes contact with the land on the PCB. Thus, this additional conductive layer makes it possible, for example, to exchange the positions of signals between the packaged IC and the PCB. Thus, for example, these interposers can be used to correct pinout errors in the packaged IC or in the PCB design.

In some embodiments, the additional conductive layer is used to provide interconnections between two balls of the packaged IC or two lands of the PCB.

In some embodiments, the additional conductive layer is used to add inductive features (e.g., transformers) between any two signals, power, and/or ground.

In some embodiments, the capacitive interposer has a comparable footprint to the packaged IC. In other embodiments, the capacitive interposer has a larger or smaller footprint than the packaged IC.

In some embodiments, the interposer is manufactured as a single unbroken device. In other embodiments, the capacitive interposer is manufactured as an array of separate tiles. These tiles can be separately soldered to the packaged IC and to the PCB, or can be combined together to form a single interposer device prior to mounting. The tiled embodiments can be particularly useful for large PC packages where the IC package and the interposer material have widely different coefficients of thermal expansion. In one embodiment, an elastomer is used to hold the tiles together, thus forming a single tiled interposer device.

According to some embodiments, a structure includes a packaged IC having a plurality of package pins disposed according to a first pattern, a PCB having a plurality of PCB lands disposed thereon according to the first pattern, a body having upper and lower surfaces, a plurality of lands disposed upon the upper surface of the body according to the first pattern and directly coupled to the package pins, and a plurality of terminals disposed upon the lower surface of the body according to the first pattern and directly coupled to the PCB lands.

The body is manufactured using a plurality of alternating conductive layers and dielectric layers, where the outermost layers are dielectric layers. A plurality of vias extends through the body orthogonal to the upper and lower surfaces, and provides an electrically conductive path between an associated land and an associated terminal. Each conductive layer in the body includes one or more electrically insulating keepouts disposed around at least a subset of the vias.

According to some embodiments, a structure includes a packaged integrated circuit (IC) and an interposer structure having a comparable footprint to the packaged IC and directly coupled to the packaged IC. The packaged IC has a plurality of package pins, including at least one ground pin and at least one power pin. The interposer structure includes a body having upper and lower surfaces, a plurality of lands disposed upon the upper surface of the body, and a plurality of terminals disposed upon the lower surface of the body.

The body is manufactured using a plurality of alternating conductive layers and dielectric layers, where the outermost layers are dielectric layers. Each land is coupled to one of the package pins of the packaged IC. A plurality of vias extends through the body orthogonal to the upper and lower surfaces, and provides an electrically conductive path between an associated land and an associated terminal. Each conductive layer in the body includes one or more electrically insulating keepouts disposed around at least a subset of the vias. One or more of the conductive layers are coupled to the ground pin, and one or more of the conductive layers are coupled to the power pin, of the packaged IC.

According to some embodiments, a system includes a packaged IC having a plurality of package pins, a printed circuit board (PCB) having a plurality of lands, and a capacitive interposer structure physically located between the PCB and the packaged IC and directly coupled therebetween. The capacitive interposer structure includes a body having upper and lower surfaces, a plurality of lands disposed upon the upper surface, and a plurality of terminals disposed upon the lower surface.

The body is manufactured using a plurality of alternating conductive layers and dielectric layers, where the outermost layers are dielectric layers. Each land of the capacitive interposer structure is coupled to one of the package pins of the packaged IC. Each terminal of the capacitive interposer structure is coupled to one of the lands of the PCB. A plurality of vias extends through the body orthogonal to the upper and lower surfaces, and provides an electrically conductive path between an associated land and an associated terminal. Each conductive layer in the body includes one or more electrically insulating keepouts disposed around at least a subset of the vias.

BRIEF DESCRIPTION OF THE DRAWINGS

The present invention is illustrated by way of example, and not by way of limitation, in the following figures.

FIG. 1 illustrates a packaged integrated circuit (IC) mounted on a printed circuit board (PCB) using a capacitive interposer according to one embodiment of the invention.

FIG. 2 is a perspective view of a capacitive interposer according to one embodiment of the invention, in which a cutaway plane and view area are delineated.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

FIG. 1 is a side view of a packaged integrated circuit (IC) 102 mounted on a printed circuit board (PCB) 101 using a capacitive interposer 103 according to one embodiment of the invention. In the pictured embodiment, packaged IC 102 comprises a ball grid array (BGA) package. Interposer 103 is a multi-layered parallel-plate capacitive device having an array of lands on one side and a corresponding array of balls on the other. The balls on the bottom surface of interposer 103 are mounted (e.g., soldered) to lands on PCB 101 using commonly known techniques. Similarly, the balls of packaged IC 102 are mounted (e.g., soldered) to the lands on the top surface of PCB 101.

The lands and balls of the interposer are connected through the body of the interposer using vias that extend from the top surface to the bottom surface. Within the interposer, the facing plates of the capacitors are manufactured using layers of conductive material sandwiched between dielectric layers and selectively coupled to the vias. For example, conductive layers can be coupled to the vias carrying power and ground, while vias carrying other signals (such as clock signals and I/O signals) simply bypass the conductive layers and connect the package pins to the PCB without adding extra capacitance.

FIG. 2 is a perspective view of a capacitive interposer, e.g., interposer 103 of FIG. 1. Note that the number of lands and terminals (e.g., balls) in all of the figures herein is purely illustrative. In practice, the number of lands and terminals could be larger or smaller, but would probably be larger in most cases. In some embodiments, the number of lands and terminals is selected to match the number of terminals on the packaged IC.

The selection of vias to be connected to the conductive layers can also be made based on the location of the power and ground pins of the particular packaged IC. For example, an IC manufacturer can provide for each packaged IC a capacitive interposer designed to provide the correct amount of capacitance to the correct package pins. For example, it is common for the I/O portion and the internal logic portion of an IC to use two different operating voltage levels. Thus, this type of IC would need to add decoupling capacitance between the ground pins and the I/O power pins, and between the ground pins and the power pins used for the internal logic. The present invention allows the manufacture of a capacitive interposer tailored to provide the necessary capacitance specific to each IC product, if desired.

Figure 3:
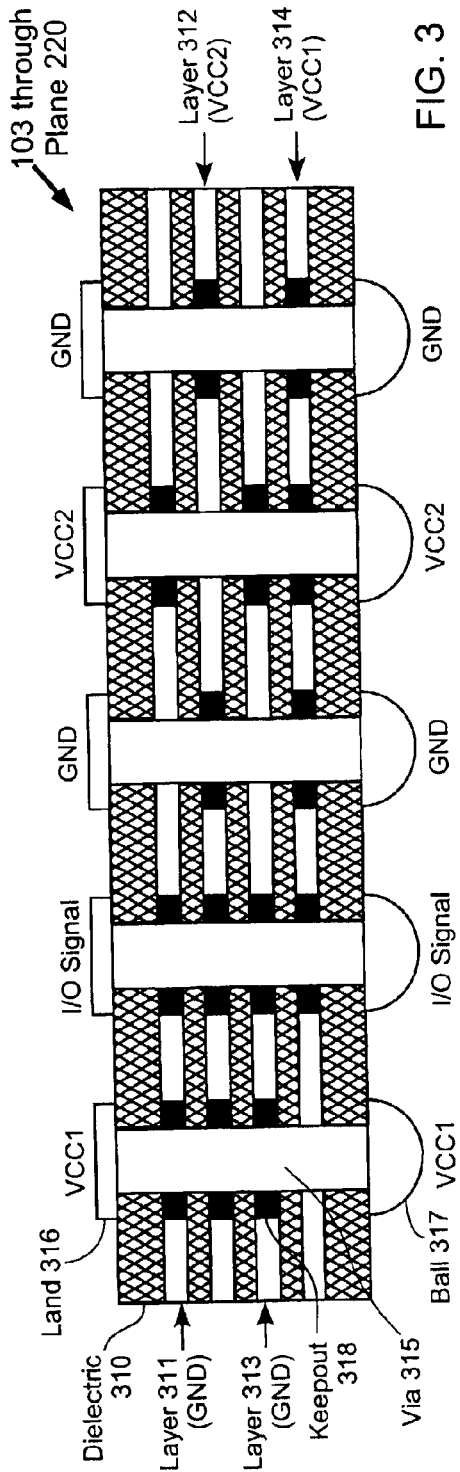
FIG. 3 is a cutaway view of a capacitive interposer according to one embodiment of the invention, through the cutaway plane shown in FIG. 2.

FIG. 2 shows the location of a cutaway plane 220. FIG. 1, for example, shows a view that could be taken along cutaway plane 220. FIG. 3 shows the internal construction of an exemplary capacitive interposer, also along cutaway plane 220.

Figure 4:
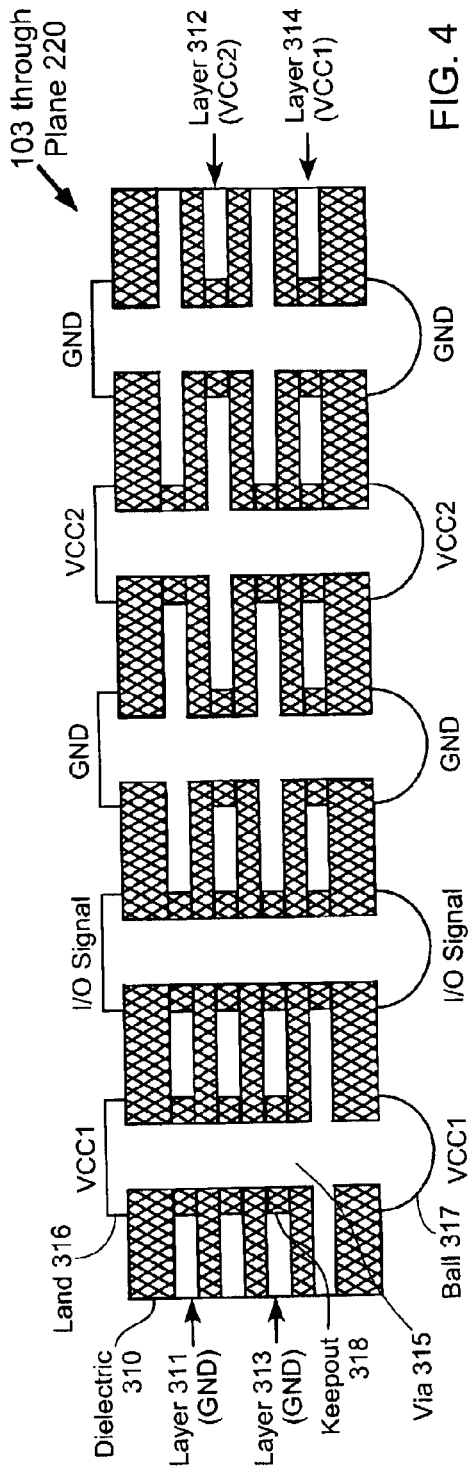
FIG. 4 is a cutaway view of a capacitive interposer similar to that of FIG. 3, but clearly showing the dielectric and conductive areas of the structure.

FIG. 3 shows the internal structural elements of an exemplary interposer according to one embodiment of the invention. Dielectric materials 310 are shown using a cross-hatched pattern. The black areas are keepouts 318, which are also composed of a dielectric material (and can be the same material as materials 310). Conductive materials (conductive layers 311–314, vias 315, lands 316, and balls 317) are shown in clear (no hatching). FIG. 4 is another view of the structure of FIG. 3 that more clearly illustrates the direct current connections within the structure. In FIG. 4, the dielectric materials are shown cross-hatched and the conductive materials are shown in clear.

Referring now to FIG. 3, the two outer layers (the top and bottom layers) of the structure are made up of dielectric material. Between the two outer layers, conductive ground layers (GND, 311 and 313) alternate with conductive power layers (VCC2 312, VCC1 314) to form parallel plate capacitors.

The number of power layers can vary. For ICs having only one power supply, there might be only one power layer. Some power supplies having heavy transient currents might need several conductive layers adjacent to ground layers. The several conductive layers are coupled together through the power vias. Some ICs have more than two power supplies and might require at least one conductive layer for each power supply. For other ICs, some power supplies (those with minimal transient currents) might not require decoupling capacitors. For some ICs, it might be desirable to continue to provide external decoupling capacitors for some power supplies using previously known methods.

Similarly, some ICs have more than one ground, e.g., a digital ground and an analog ground, or an input/output ground and a ground used only for the internal core of the IC. Thus, an interposer according to the invention can include more than one ground and can require at least one conductive layer for each ground.

It will be apparent to one skilled in the art that the invention can be practiced within these and other architectural variations.

The conductive layers are coupled to the desired lands 316 (and hence to the desired pins of the packaged IC) through the vias 315. As can be seen from FIG. 3, a connection is made from the via to a conductive layer only when no keepout is present. For example, the leftmost via in FIG. 3 is coupled to the VCC1 pin of the packaged IC. Keepouts are present for the top three conductive layers (311, 312, and 313), so the via has no electrical contact with these layers. However, no keepout is present for the bottommost conductive layer 314, so this layer is electrically coupled to VCC1.

Similarly, the fourth via from the left is coupled both to the VCC2 pin of the packaged IC and to conductive layer 312. The third and fifth vias from the left are coupled to ground pins of the packaged IC and to conductive layers 311 and 313. In the pictured embodiment, layers 311 and 313 are each coupled to both ground pins. This duplication is desirable to reduce inductance and resistance, thereby providing a more effective decoupling capacitance. The second via from the left is coupled to an I/O signal of the packaged IC and does not contact any of the conductive layers in the interposer structure.

Each of the vias 315 is coupled to an associated ball 317 disposed on the bottom surface of the interposer structure. Thus, each pin of the packaged IC is coupled through the associated via to a corresponding land of the PCB.

The interposer structure of FIG. 3 can be manufactured using conventional manufacturing techniques used, for example, for manufacturing PCBs, IC package substrates, and various types of capacitors. Examples of techniques that can be used include "core panel and pre-preg" techniques commonly used in manufacturing PCBs, "build-up" techniques commonly used in manufacturing IC package substrates, and sintering techniques commonly used in manufacturing capacitors.

FIGS. 5A–7C illustrate the formation of the keepouts 318 shown in FIG. 3. The areas of the layer surfaces shown in FIGS. 5A–7C can correspond, for example, to area 230 delineated in FIG. 2.

Figure 5A:
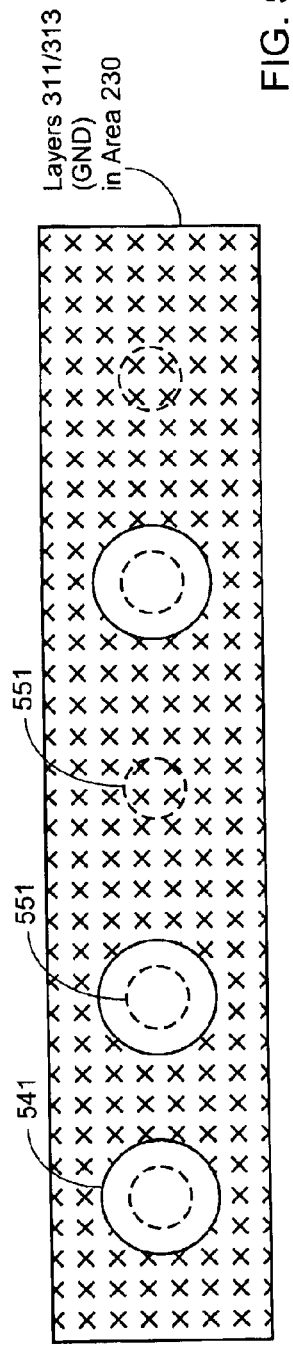
FIGS. 5A–5C illustrate the various conductive layers shown in the cutaway view of FIG. 3, within the view area shown in FIG. 2.
Figure 5B:
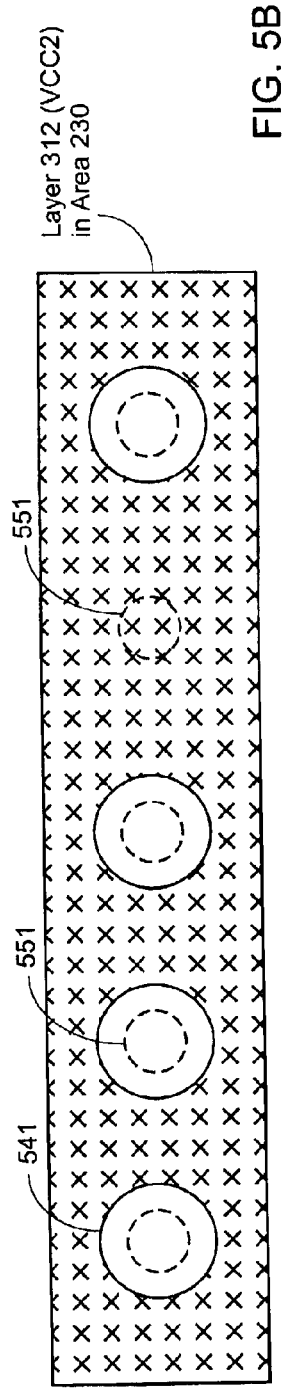
Figure 5C:
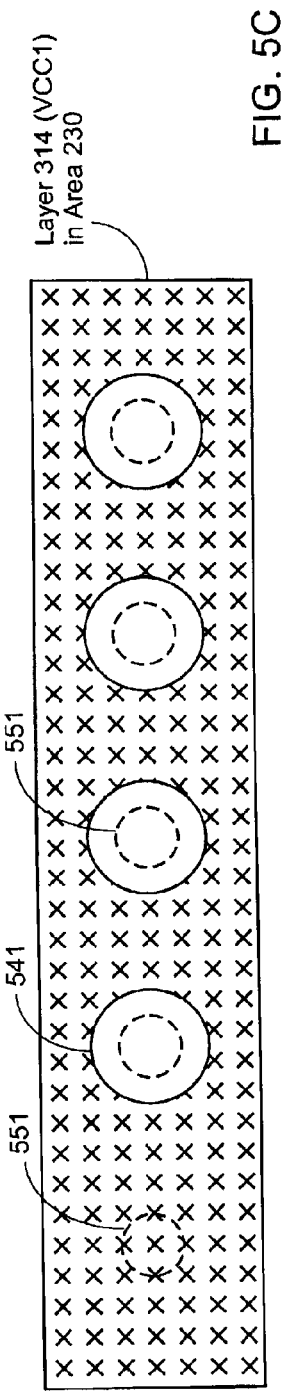

FIGS. 5A–5C show the various conductive layers in the structure of FIG. 3, with the keepout areas shown as clear areas 541 in the conductive material. (The small dashed circles 551 indicate where the vias will later be inserted.) To form the keepout areas, the conductive layers include holes in the conductive material. The conductive layers can be layers of metal, such as copper, for example. In some embodiments, the keepout areas are etched out of a solid layer, as in the core panel and pre-preg technique. In some embodiments, the keepout areas are simply left open when the conducting layer is laid down, as in the build-up technique.

Where a keepout area is present, there will be no electrical connection between the conductive layer and the associated via. FIG. 5A shows conductive layers 311 and 313, which are coupled to the two ground vias shown in FIG. 3. Similarly, FIG. 5B shows layer 312, which is coupled to the VCC2 via in FIG. 3. FIG. 5C shows layer 314, which is coupled to the VCC1 via in FIG. 3.

Adjacent to each keepout area is a dielectric layer, as shown in FIG. 3. In some embodiments, the dielectric material in the adjacent dielectric layer flows into the keepout area, thereby forming the electrically insulating keepout. In some embodiments, the keepout area is filled with dielectric material during the manufacture of the adjacent dielectric layer. In other embodiments, other techniques are used.

Figure 6A:
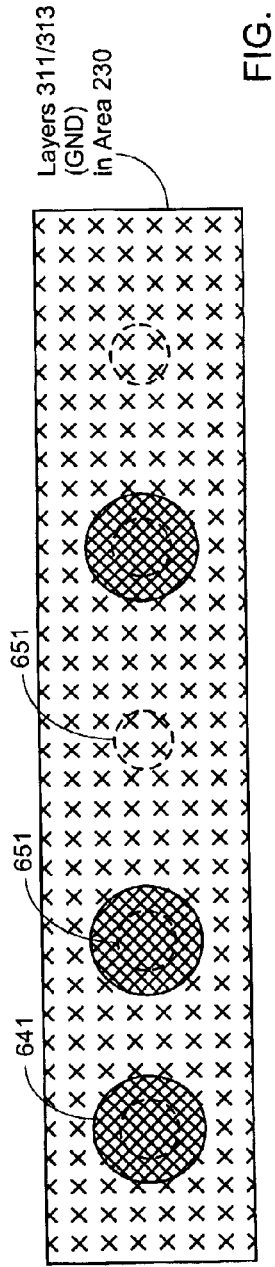
FIGS. 6A–6C show the conductive layers of FIG. 3 after the keepout areas are filled with a dielectric material.
Figure 6B:
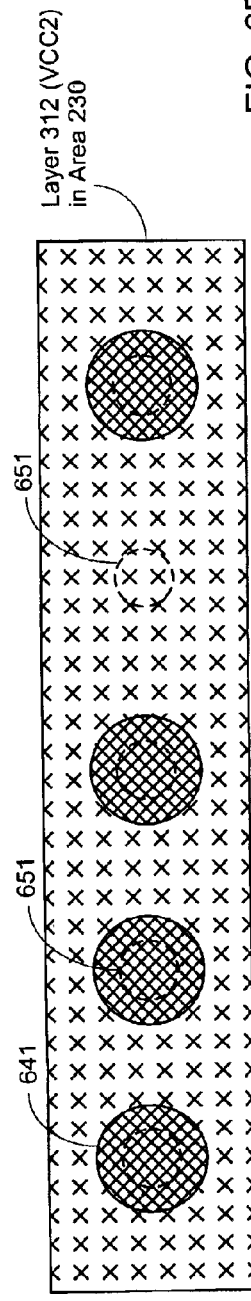
Figure 6C:
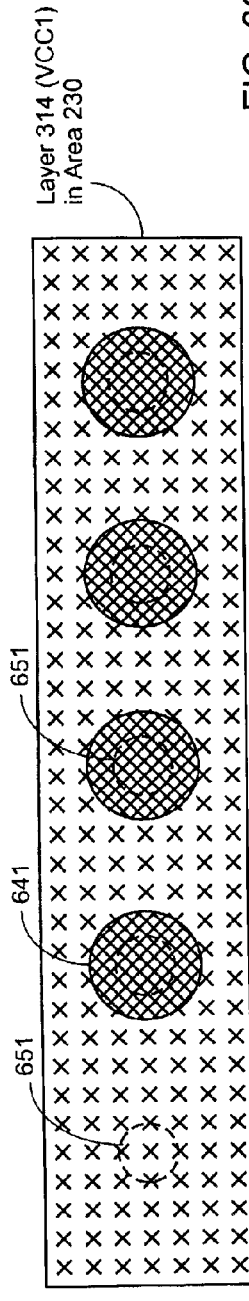

FIGS. 6A–6C show the conductive layers after the keepout areas are filled with dielectric material. The small dashed circles 651 in FIGS. 6A–6C show where the vias will be located. In some embodiments, via holes are drilled when the manufacture of the layered body is complete. In some embodiments, the body is manufactured as two or more separate layered bodies, in which via holes are drilled before the layered bodies are joined to form the complete interposer body. In other embodiments, vias are manufactured using other techniques, such as laser cutting.

Figure 7A:
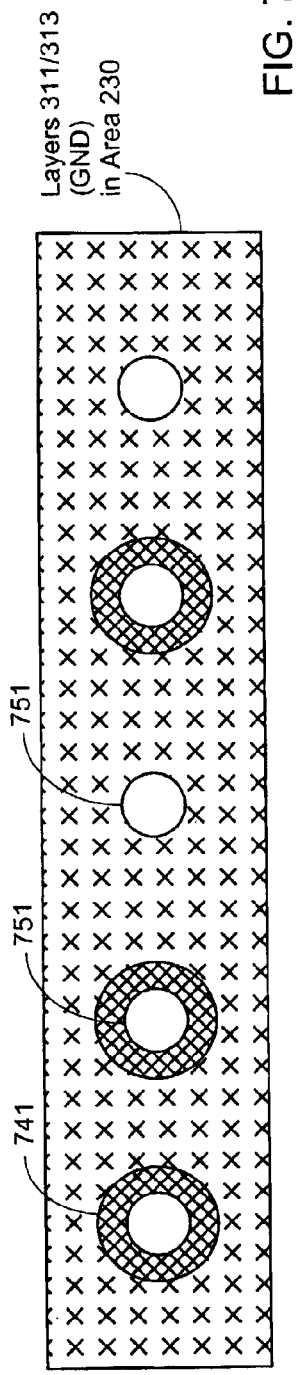
FIGS. 7A–7C show the conductive layers of FIG. 3 after the keepout areas are filled with dielectric material and holes for the vias are drilled.
Figure 7B:
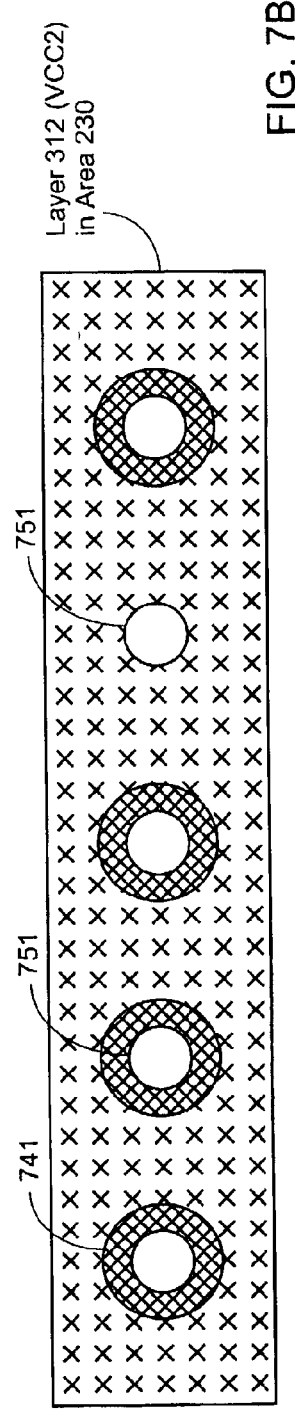
Figure 7C:
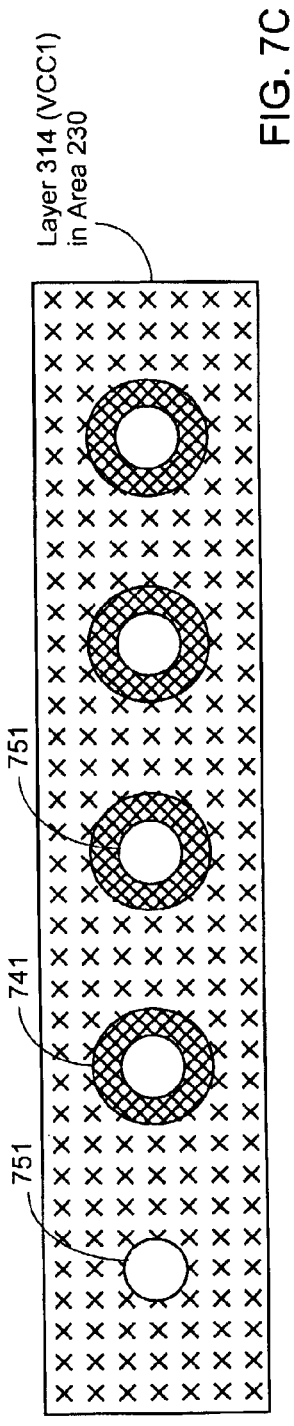

FIGS. 7A–7C show the keepouts 741 in each conductive layer of FIG. 3 after the via holes 751 are drilled.

In some embodiments, the via holes 751 are then plated with a conductive plating material using conventional techniques, and in some embodiments filled with solder. In some embodiments, the balls and/or lands are then applied.

In some embodiments, the capacitive interposer has a comparable footprint to the packaged IC, as shown in FIG. 1. In other embodiments, the capacitive interposer has a larger footprint than the packaged IC. In yet other embodiments, the capacitive interposer has a smaller footprint than the packaged IC.

In some embodiments, the interposer is manufactured as a single unbroken device having a comparable footprint to the packaged IC. This arrangement has the advantage of simplicity, because all of the package pins can be easily connected to the PCB using a single interposer. However, the arrangement can cause problems if the thermal coefficient of expansion varies widely between the interposer and either or both of the packaged IC and the PCB.

PCBs and IC packages are typically made of organic materials. However, it can be desirable to use ceramic insulators to manufacture the interposer. Ceramic insulators typically have a higher dielectric constant than organic insulators, i.e., they can provide greater capacitance using the same thickness of material. However, for larger devices the difference in the thermal coefficients of expansion between the ceramic materials of the interposer and the organic materials of the package and/or PCB can physically stress the soldering between the different structures. Known techniques such as underfill can alleviate this problem. However, some embodiments of the invention use a different technique instead of or in addition to the underfill approach.

In some embodiments, several smaller interposers are used to mount a larger packaged IC to a PCB. When several smaller interposers are used, they can individually expand and/or contract over several smaller areas, rather than experiencing a larger expansion and/or contraction over a single larger area. Thus, the structure can withstand greater variations in temperature without failure.

Figure 8:
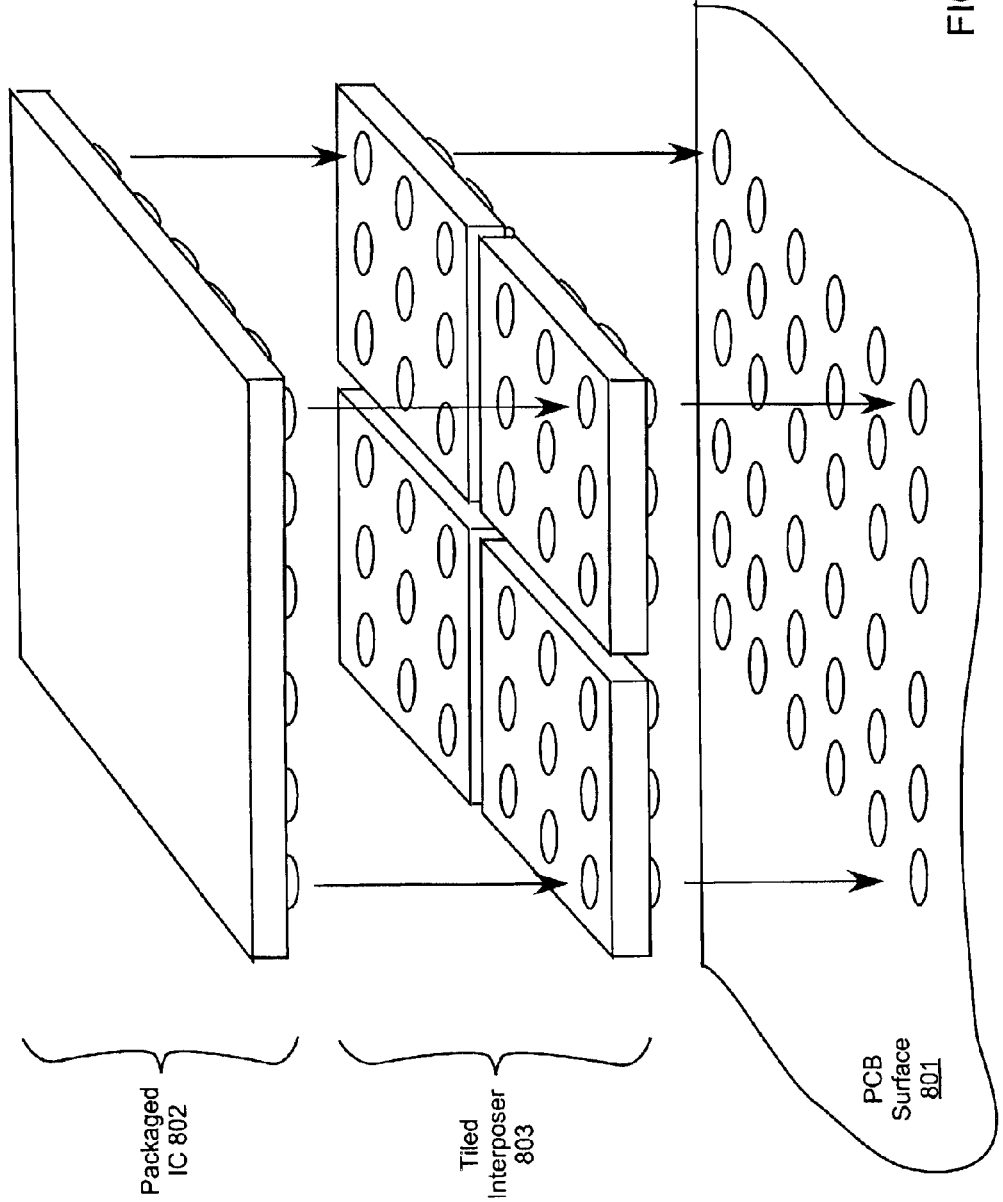
FIG. 8 illustrates how several capacitive interposer structures can be used to couple a single packaged IC to a PCB.

FIG. 8 shows one such embodiment. In the pictured embodiment, the smaller interposers ("tiles") are separately soldered to the packaged IC and to the lands of the PCB. In other embodiments (not shown), the tiles are combined together to form a single interposer device prior to mounting. In one embodiment, an elastomer is used to hold the tiles together, thus forming the single interposer device. The elastomer also serves to absorb mechanical stresses from thermal expansion and/or contraction.

ICs are often manufactured using more than one power supply and/or more than one ground. For example, an IC can use a different power supply (VCC) for each quadrant of the device. Therefore, it can be useful to divide the conductive layers of the interposer to correspond to the power supply divisions on the device, thereby providing two or more separate capacitors using different regions of the same conductive layers. The different regions do not have a direct current connection, but each is capacitively coupled to the ground layers.

Figure 9:
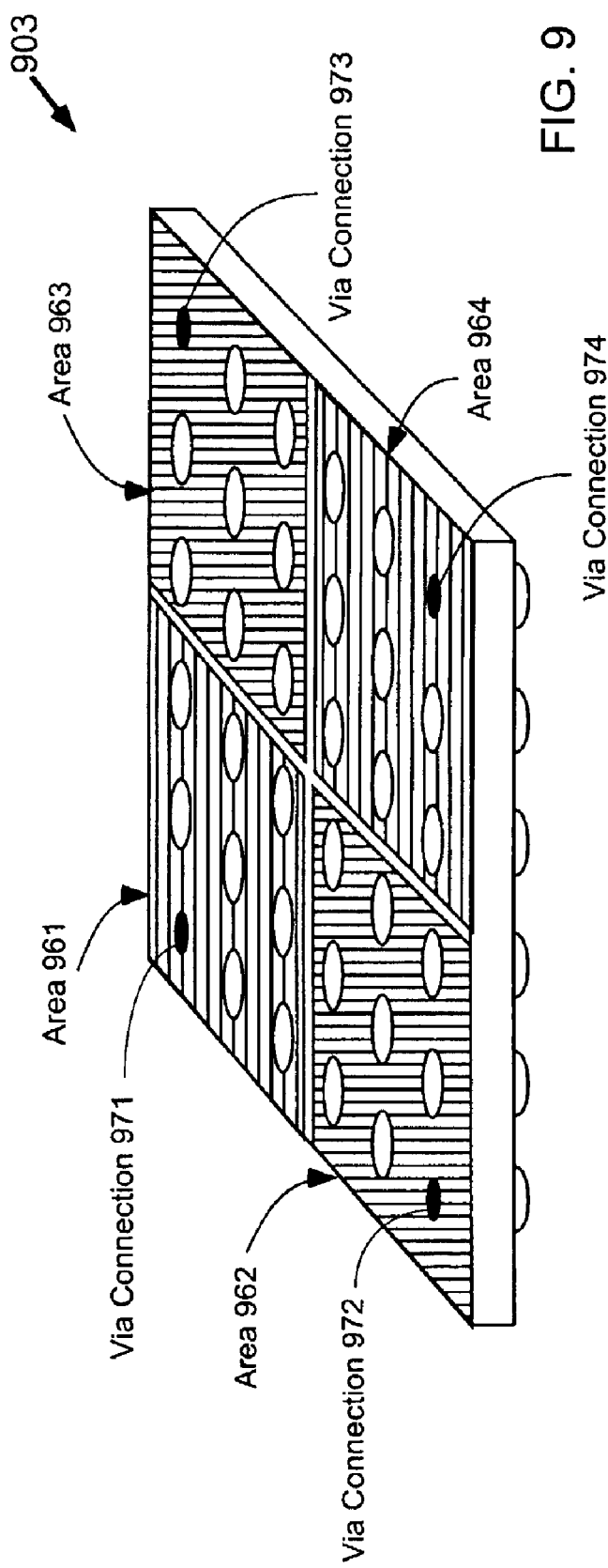
FIG. 9 shows how a single conductive layer can be split up into several areas to implement several different capacitors.

FIG. 9 shows how a single conductive layer can be split up into four quadrants to implement four different capacitors. For example, FIG. 9 shows how the interposer could appear if the top layer of dielectric were removed. In the pictured embodiment, the four areas 961–964 each include one via 971–974 that connects to the power supply for the quadrant.

In some embodiments, some conductive layers are "unified" (manufactured as a single electrical element), and some conductive layers are divided into two or more areas having no direct current connection to each other. In some embodiments, the ground layers are unified and the power layers are divided. In some embodiments, some power supplies share the same conductive layers, while some power supplies have separate unified conductive layers.

Those having skill in the relevant arts of the invention will now perceive various modifications and additions that can be made as a result of the disclosure herein. For example, the above text describes the systems and structures of the invention in the context of ICs packaged in ball grid array (BGA) packages. However, the various embodiments of the invention can also be implemented using other types of IC packages. As another example, the materials and processes described herein are only examples of the materials and processes that can be used to manufacture the structures described herein, including both known materials and processes and materials and processes that have yet to be developed.

Accordingly, all such modifications and additions are deemed to be within the scope of the invention, which is to be limited only by the appended claims and their equivalents.

What is claimed is:

1. A structure, comprising:
   a packaged integrated circuit (IC) having a plurality of package pins disposed according to a first pattern;
   a printed circuit board (PCB) having a plurality of PCB lands disposed thereon according to the first pattern;
   a body having upper and lower surfaces, the body comprising a plurality of alternating conductive layers and dielectric layers, the outermost layers comprising dielectric layers;
   a plurality of lands disposed upon the upper surface of the body according to the first pattern and directly coupled to the package pins;
   a plurality of terminals disposed upon the lower surface of the body according to the first pattern and directly coupled to the PCB lands; and
   a plurality of vias through the body and orthogonal to the upper and lower surfaces, each via providing an electrically conductive path between an associated land and an associated terminal, wherein;
   each conductive layer in the body comprises one or more electrically insulating keepouts disposed around at least a subset of the vias.

2. The structure of claim 1, wherein a subset of the vias are not in electrical contact with any of the conductive layers.

3. The structure of claim 2, wherein at least some of the subset of vias are manufactured using a resistive material.

4. The structure of claim 1, wherein the vias comprise soldering material added to the structure after the manufacture of the body.

5. The structure of claim 1, wherein the dielectric layers comprise at least one of a group of materials including: a ceramic material, an organic material, and a non-ceramic inorganic material.

6. The structure of claim 1, wherein each of the dielectric layers comprises at least one of a group of materials including: a ceramic material, an organic material, and a non-ceramic inorganic material.

7. The structure of claim 5, wherein at least two of the dielectric layers are comprised of different dielectric materials.

8. The structure of claim 1, wherein at least one of the dielectric layers comprises a composite material including epoxy.

9. The structure of claim 1, wherein the body comprises a single unbroken device.

10. The structure of claim 1, wherein the body comprises an array of tiles coupled together using an elastomer material.

11. The structure of claim 1, wherein the terminals are balls similar to those used in a ball grid array (BGA) package.

12. The structure of claim 1, wherein at least one conductive layer is divided into two or more areas not having a direct current connection with each other.

13. The structure of claim 1, further comprising a plurality of conductive traces disposed between two of the dielectric layers and providing electrically conductive paths between pairs of the lands and the terminals, wherein the land and the terminal of each pair are positioned in different locations on the body.

14. The structure of claim 1, further comprising a plurality of conductive traces disposed between two of the dielectric layers and providing electrically conductive paths between pairs of the lands.

15. The structure of claim 1, further comprising a plurality of conductive traces disposed between two of the dielectric layers and providing electrically conductive paths between pairs of the terminals.

16. The structure of claim 1, wherein the conductive layers include at least two ground layers and at least one power layer, and the conductive layers are disposed in alternate ground and power layers.

17. The structure of claim 1, further comprising:
   at least one electrically conductive trace disposed between two of the dielectric layers;
   a first partial via extending from and electrically coupling at least one of the lands to the at least one electrically conductive trace; and
   a second partial via extending from and electrically coupling at least one of the terminals to the at least one electrically conductive trace.

18. The structure of claim 1, further comprising:
   at least one electrically conductive trace disposed between two of the dielectric layers;
   a first partial via extending from and electrically coupling a first one of the lands to the at least one electrically conductive trace; and
   a second partial via extending from and electrically coupling a second one of the lands to the at least one electrically conductive trace.

19. The structure of claim 1, further comprising:
   at least one electrically conductive trace disposed between two of the dielectric layers;
   a first partial via extending from and electrically coupling a first one of the terminals to the at least one electrically conductive trace; and
   a second partial via extending from and electrically coupling a second one of the terminals to the at least one electrically conductive trace.

20. A system, comprising:
   a packaged integrated circuit (IC) having a plurality of package pins;
   a printed circuit board (PCB) having a plurality of lands disposed thereon; and
   a first capacitive interposer structure physically located between the PCB and the packaged IC and directly coupled therebetween, the first capacitive interposer structure comprising:
      a body having upper and lower surfaces, the body comprising a plurality of alternating conductive layers and dielectric layers, the outermost layers comprising dielectric layers;
      a plurality of lands disposed upon the upper surface of the body, each land being coupled to one of the package pins of the packaged IC;
      a plurality of terminals disposed upon the lower surface of the body, each terminal being coupled to one of the lands of the PCB; and
      a plurality of vias through the body and orthogonal to the upper and lower surfaces, each via providing an electrically conductive path between an associated land and an associated terminal, wherein:
      each conductive layer in the body comprises one or more electrically insulating keepouts disposed around at least a subset of the vias.

21. The system of claim 20, wherein the lands on the PCB are disposed to correspond to the locations of the package pins of the packaged IC.

22. The system of claim 20, wherein:
the package pins of the packaged IC include at least one ground pin and at least one power pin;
one or more conductive layers are coupled to the ground pin of the packaged IC; and
one or more conductive layers are coupled to the power pin of the packaged IC.

23. The system of claim 22, wherein:
the package pins of the packaged IC further include at least an additional power pin not having a direct current connection to the at least one power pin; and
one or more conductive layers are coupled to the additional power pin of the packaged IC.

24. The system of claim 20, wherein the terminals are balls similar to those used in a ball grid array (BGA) package.

25. The system of claim 20 wherein:
the packaged IC comprises a ball grid array (BGA) package wherein each package pin is a ball; and
each ball of the BGA package is soldered to a corresponding land of the first capacitive interposer structure.

26. The system of claim 20 wherein:
the package pins of the packaged IC include a plurality of signal pins;
the vias include a plurality of signal vias coupled to the plurality of signal pins; and
the signal vias are not in electrical contact with any of the conductive layers.

27. The system of claim 26, wherein at least one of the signal vias is manufactured using a resistive material.

28. The system of claim 20, wherein the first capacitive interposer structure has a comparable footprint to the packaged IC.

29. The system of claim 20, wherein the first capacitive interposer structure has a larger footprint than the packaged IC.

30. The system of claim 20, wherein:
the first capacitive interposer structure has a smaller footprint than the packaged IC and is coupled to fewer than all of the package pins; and
the structure further comprises one or more additional capacitive interposer structures coupled to the remaining package pins of the IC and further coupled to the lands of the PCB.

31. The system of claim 30 wherein the combined footprints of the first capacitive interposer structure and the additional capacitive interposer structures are about the same as the footprint of the packaged IC.

32. The system of claim 30, wherein the first capacitive interposer structure and the additional capacitive interposer structures are fastened together using an elastomer material.

33. The system of claim 20, wherein at least one of the conductive layers is divided into first and second areas not having a direct current connection with each other.

34. The system of claim 33, wherein:
the package pins of the packaged IC include at least an additional power pin not having a direct current connection to the at least one power pin;
the first area is coupled to the at least one power pin; and
the second area is coupled to the additional power pin.

35. The system of claim 20, wherein the body of the capacitive interposer structure further comprises a plurality of conductive traces disposed between two of the dielectric layers and providing electrically conductive paths between pairs of the lands and the terminals, wherein the land and the terminal of each pair are positioned in different locations on the body.

36. The system of claim 20, wherein the body of the capacitive interposer structure further comprises an additional conductive layer comprising a plurality of conductive traces disposed between two of the dielectric layers and providing electrically conductive paths between pairs of the lands.

37. The system of claim 20, wherein the body of the capacitive interposer structure further comprises a plurality of conductive traces disposed between two of the dielectric layers and providing electrically conductive paths between pairs of the terminals.

38. The system of claim 20, wherein at least two of the dielectric layers are comprised of different dielectric materials.

39. The system of claim 20, wherein the conductive layers include at least two ground layers and at least one power layer, and the conductive layers are disposed in alternate ground and power layers.

40. The system of claim 20, further comprising:
at least one electrically conductive trace disposed between two of the dielectric layers;
a first partial via extending from and electrically coupling at least one of the lands to the at least one electrically conductive trace; and
a second partial via extending from and electrically coupling at least one of the terminals to the at least one electrically conductive trace.

41. The system of claim 20, further comprising:
at least one electrically conductive trace disposed between two of the dielectric layers;
a first partial via extending from and electrically coupling a first one of the lands to the at least one electrically conductive trace; and
a second partial via extending from and electrically coupling a second one of the lands to the at least one electrically conductive trace.

42. The system of claim 20, further comprising:
at least one electrically conductive trace disposed between two of the dielectric layers;
a first partial via extending from and electrically coupling a first one of the terminals to the at least one electrically conductive trace; and
a second partial via extending from and electrically coupling a second one of the terminals to the at least one electrically conductive trace.

43. An interposer, comprising:
a plurality of alternate planar conductive layers and planar dielectric layers, the dielectric layers including first and second outermost layers;
a plurality of lands disposed on an outer surface of the first dielectric layer in a pattern;
a plurality of terminals disposed on an outer surface of the second dielectric layer in the pattern of the lands;
a plurality of vias formed through the planar conductive and dielectric layers and orthogonal to the outer surfaces, each via providing an electrically conductive path between a land and a terminal at a corresponding position in the pattern; and
a plurality of electrically insulative structures, each structure surrounding a via in one of the planar conductive layers and surrounded by electrically conductive material in the planar conductive layer.

44. The interposer of claim 43, wherein a at least one of the vias is insulated from electrical contact with all of the planar conductive layers.

45. The interposer of claim 43, wherein the dielectric layers comprise at least one of a group of materials including: a ceramic material, an organic material, and a non-ceramic inorganic material.

46. The interposer of claim 45, wherein at least two of the dielectric layers are comprised of different dielectric materials.

47. The interposer of claim 43, wherein each of the dielectric layers comprises at least one of a group of materials including: a ceramic material, an organic material, and a non-ceramic inorganic material.

48. The interposer of claim 43, wherein at least one of the dielectric layers comprises a composite material including epoxy.

49. The interposer of claim 43, wherein the planar conductive layers include at least two ground layers and at least one power layer, and the conductive layers are disposed in alternate ground and power layers.

50. The interposer of claim 43, further comprising:
   at least one electrically conductive trace disposed between two of the dielectric layers;
   a first partial via extending from and electrically coupling at least one of the lands to the at least one electrically conductive trace; and
   a second partial via extending from and electrically coupling at least one of the terminals to the at least one electrically conductive trace.

51. The interposer of claim 43, further comprising:
   at least one electrically conductive trace disposed between two of the dielectric layers;
   a first partial via extending from and electrically coupling a first one of the lands to the at least one electrically conductive trace; and
   a second partial via extending from and electrically coupling a second one of the lands to the at least one electrically conductive trace.

52. The interposer of claim 43, further comprising:
   at least one electrically conductive trace disposed between two of the dielectric layers;
   a first partial via extending from and electrically coupling a first one of the terminals to the at least one electrically conductive trace; and
   a second partial via extending from and electrically coupling a second one of the terminals to the at least one electrically conductive trace.

53. An interposer, comprising:
   an array of tiles coupled together using an elastomer material, wherein each tile includes,
      a plurality of alternate planar conductive layers and planar dielectric layers, the dielectric layers including first and second outermost layers;
      a plurality of lands disposed on an outer surface of the first dielectric layer in a pattern;
      a plurality of terminals disposed on an outer surface of the second dielectric layer in the pattern of the lands;
      of vias formed through the planar conductive and dielectric layers and orthogonal to the outer surfaces, each via providing an electrically conductive path between a land and a terminal at a corresponding position in the pattern; and
      a plurality of electrically insulative structures, each structure surrounding a via in one planar conductive layers and surrounded by electrically conductive material in the planar conductive layer.

* * * * *